US009157796B2

(12) United States Patent
Shimotsusa et al.

(10) Patent No.: US 9,157,796 B2
(45) Date of Patent: Oct. 13, 2015

(54) PHOTOELECTRIC CONVERSION APPARATUS AND IMAGE PICKUP SYSTEM HAVING PHOTOELECTRIC CONVERSION APPARATUS WITH SUBSTRATE INCLUDING FIRST AND SECOND CIRCUITS HAVING FIRST AND SECOND DRIVE FREQUENCIES

(71) Applicant: CANON KABUSHIKI KAISHA, Tokyo (JP)

(72) Inventors: Mineo Shimotsusa, Machida (JP); Koichiro Iwata, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 154 days.

(21) Appl. No.: 13/742,145

(22) Filed: Jan. 15, 2013

(65) Prior Publication Data

US 2013/0221197 A1 Aug. 29, 2013

(30) Foreign Application Priority Data

Feb. 29, 2012 (JP) ................................. 2012-043964

(51) Int. Cl.
*H01L 27/00* (2006.01)
*G01J 1/44* (2006.01)
*H01L 27/146* (2006.01)
*H04N 5/33* (2006.01)
*H04N 5/369* (2011.01)
*H04N 5/378* (2011.01)

(52) U.S. Cl.
CPC ............. *G01J 1/44* (2013.01); *H01L 27/14601* (2013.01); *H04N 5/33* (2013.01); *H04N 5/369* (2013.01); *H04N 5/378* (2013.01)

(58) Field of Classification Search
CPC .................................................. H01L 27/14634
USPC ................. 13/239, 214 R; 257/686, E25.006, 257/E25.013; 438/74; 250/239, 214 R, 250/208.1
See application file for complete search history.

(56) References Cited

U.S. PATENT DOCUMENTS

| | | | |
|---|---|---|---|
| 7,164,113 B2 * | 1/2007 | Inokuma et al. ........... | 250/208.1 |
| 2012/0293698 A1 * | 11/2012 | Sukegawa et al. ............ | 348/294 |
| 2013/0105667 A1 * | 5/2013 | Kobayashi ................. | 250/208.1 |
| 2013/0126709 A1 * | 5/2013 | Blanquart .................. | 250/208.1 |

FOREIGN PATENT DOCUMENTS

| | | |
|---|---|---|
| JP | 2011-061767 A | 3/2011 |
| JP | 2011-159958 A | 8/2011 |
| JP | 2011-188515 A | 9/2011 |
| JP | 2012-015277 A | 1/2012 |
| JP | 2012-033894 A | 2/2012 |
| WO | WO2012/001935 | * 1/2012 |

* cited by examiner

*Primary Examiner* — Thanh Luu
(74) *Attorney, Agent, or Firm* — Canon USA, Inc. IP Division

(57) ABSTRACT

A photoelectric conversion apparatus according to one aspect of the present invention includes a first substrate including a photoelectric conversion region and a surrounding region, and a second substrate including a circuit for processing a signal from the photoelectric conversion region, and overlapping the first substrate. In this case, the circuit for processing a signal from the photoelectric conversion region includes a first circuit and a second circuit with a higher drive frequency than that of the first circuit. In an orthogonal projection, the second circuit is only provided in the photoelectric conversion region.

20 Claims, 14 Drawing Sheets

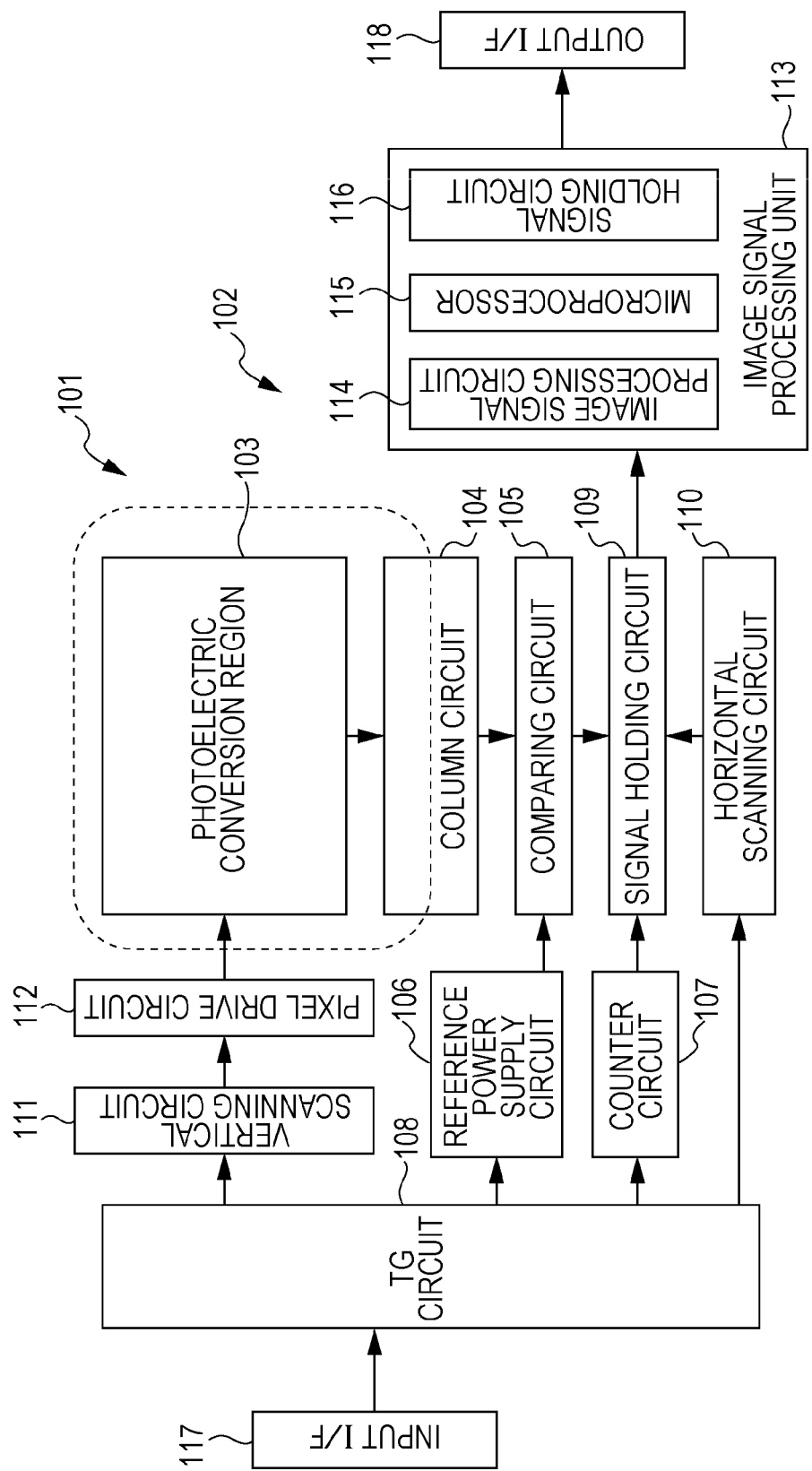

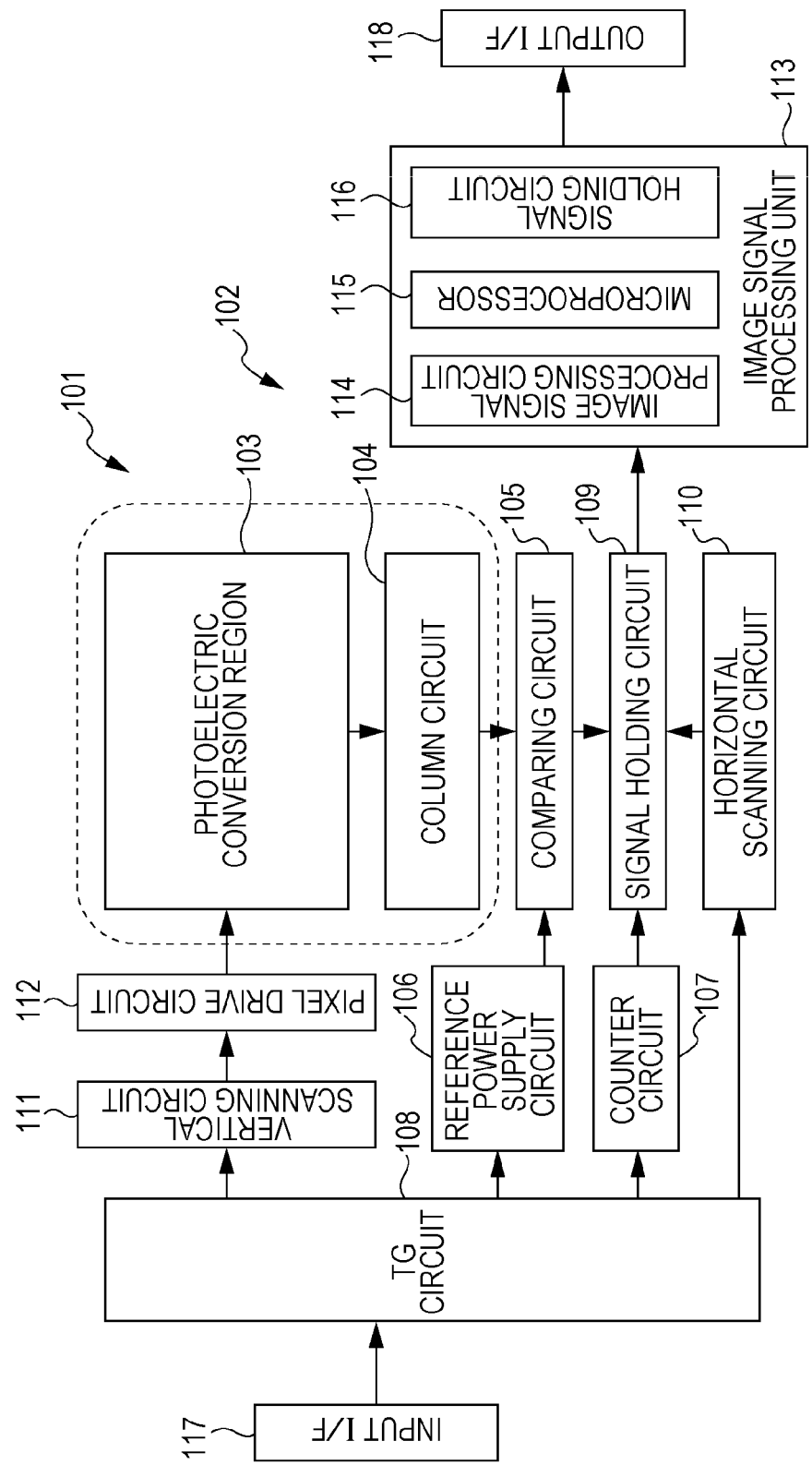

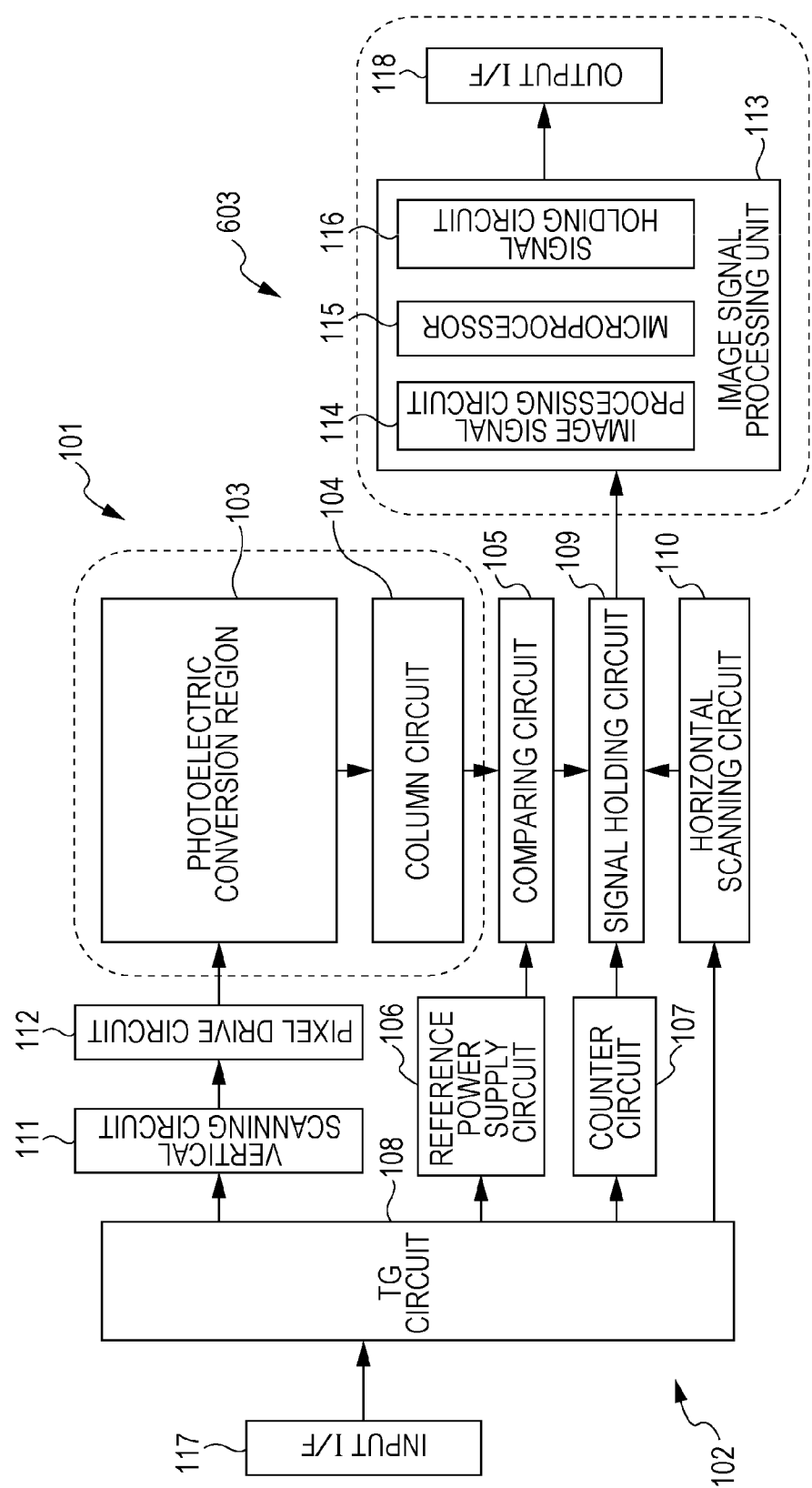

PHOTOELECTRIC CONVERSION APPARATUS AND IMAGE PICKUP SYSTEM HAVING PHOTOELECTRIC CONVERSION APPARATUS WITH SUBSTRATE INCLUDING FIRST AND SECOND CIRCUITS HAVING FIRST AND SECOND DRIVE FREQUENCIES

BACKGROUND OF THE INVENTION

1. Field of the Invention

The present invention relates to photoelectric conversion apparatuses in which a plurality of substrates are stacked.

2. Description of the Related Art

In recent years, CMOS type photoelectric conversion apparatuses in which a plurality of substrates (what is called a chip) are stacked have been studied for size reduction and enhancement of characteristics. Japanese Patent Laid-Open No. 2011-159958 discloses a stacked photoelectric conversion apparatus including a first chip having pixels and a circuit required to have an analog characteristic and/or a noise characteristic and a second chip having a circuit that runs fast with a low voltage.

SUMMARY OF THE INVENTION

A photoelectric conversion apparatus according to one aspect of the present invention includes a first substrate including a photoelectric conversion region including a photoelectric conversion element and a circuit for reading a signal from the photoelectric conversion region, and a surrounding region, and a second substrate including a circuit for processing a signal from the photoelectric conversion region, and overlapping the first substrate. In this case, the circuit for processing a signal from the photoelectric conversion region includes a first circuit and a second circuit with a higher drive frequency than that of the first circuit. In an orthogonal projection, the second circuit is only provided in the surrounding region.

Further features of the present invention will become apparent from the following description of exemplary embodiments with reference to the attached drawings.

BRIEF DESCRIPTION OF THE DRAWINGS

FIG. 1A is a block diagram for describing an overall photoelectric conversion apparatus of a first embodiment.

FIG. 2A is a block diagram for describing an overall photoelectric conversion apparatus of a second embodiment.

FIG. 7A is a block diagram for describing an overall photoelectric conversion apparatus of a seventh embodiment.

DESCRIPTION OF THE EMBODIMENTS

Figure 1B:
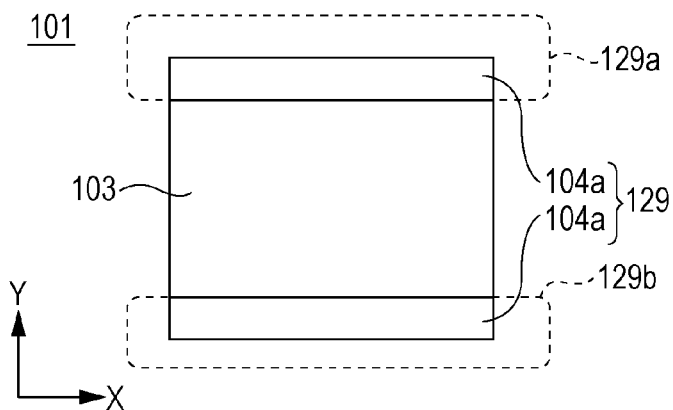
FIG. 1B is a block diagram for describing a first substrate of the photoelectric conversion apparatus of the first embodiment.

The present inventors have found in the configuration of Japanese Patent Laid-Open No. 2011-159958 that heat generated in circuits may increase noise and reduce image quality. This is because of an increase of dark frame noise in a photoelectric conversion region where heats of circuits may overlap. Accordingly, a photoelectric conversion apparatus according to an embodiment of the present invention may provide a stacked photoelectric conversion apparatus with reduced noise.

A photoelectric conversion apparatus according to a plurality of embodiments includes a first substrate and a second substrate. The first substrate includes a photoelectric conversion region and a surrounding region. The second substrate includes a circuit that processes a signal from the photoelectric conversion region and overlaps the first substrate. The circuit that processes a signal from the photoelectric conversion region includes a first circuit and a second circuit with a higher drive frequency than the first circuit. In the orthogonal projection, the second circuit is provided in the surrounding region.

Providing circuits that generate heat externally to the photoelectric conversion region in the configuration may inhibit an increase of noise.

An unbalanced arrangement of circuits that generate heat in a plane of the photoelectric conversion region may possibly cause large image irregularities. This is because a heat distribution occurs in a plane of the photoelectric conversion region, which then causes a distribution of dark frame noise.

On the other hand, a uniform arrangement of circuits in the photoelectric conversion region may reduce noise irregularities.

The photoelectric conversion region has a plurality of pixels including a photoelectric conversion element and includes a photoelectric conversion element and a circuit for reading a signal from the photoelectric conversion element. The photoelectric conversion region may also be called an image region. A signal from the photoelectric conversion region may be used for imaging, focal point detection or illuminance detection. For example, in a CMOS photoelectric conversion apparatus, the photoelectric conversion region has an array of pixels containing photodiodes that are photoelectric conversion elements and/or an array of pixel cells containing a plurality of photoelectric conversion elements. For example, a current source provided for each column or a pixel drive circuit provided for each row is not included in the photoelectric conversion region.

The surrounding region is a part of the first substrate having the photoelectric conversion region and excludes the photoelectric conversion region. The surrounding region may have a circuit that processes a signal from the photoelectric conversion region, like the second substrate.

Each of the first substrate and the second substrate contain a semiconductor substrate, a wiring layer, and an insulating layer. The surface closer to the wiring layer of the substrate will be called a front side, and the opposite surface will be called a back side. The surface having an element of a semiconductor substrate such as a boundary face against a gate insulating layer of a MOS transistor will be called a principal face. In the following embodiments, the orthogonal projection is assumed to be projected toward the principal face of the second substrate. The expression, "circuit overlaps a certain region" or "circuit is provided in a certain region", means that a circuit is provided in a region in the orthogonal projection projected toward the principal face of the second substrate. Alternatively, it means that the orthogonal projections of a circuit and a region to the principal face of the second substrate overlap. A plane of a semiconductor substrate on which an element is provided, that is, an element-formed-range of the principal face is regarded as a range where a circuit is provided. In the following embodiments, the first substrate and the second substrate are assumed to overlap such that a front side of the first substrate and a front side of the second substrate may face against each other. However, any sides may face against each other when the first substrate and the second substrate overlap.

Embodiments will be described below more specifically with reference to drawings.

First Embodiment

A photoelectric conversion apparatus according to a first embodiment will be described with reference to FIGS. 1A to 1D. First of all, with reference to FIG. 1A, an overall photoelectric conversion apparatus of this embodiment will be described.

FIG. 1A is a block diagram for describing the overall photoelectric conversion apparatus. The photoelectric conversion apparatus has a photoelectric conversion region 103. The photoelectric conversion region 103 has a plurality of pixels containing a photoelectric conversion element and performs photoelectric conversion for imaging. The photoelectric conversion region 103 has a column signal line for outputting a signal from a pixel. In other words, the photoelectric conversion region includes pixels and a column signal line.

Each of the pixels includes at least one photoelectric conversion element and a circuit for reading a signal from the photoelectric conversion element. Each of the pixels according to this embodiment contains a transfer transistor, a reset transistor, and a source follower transistor included in a source follower circuit but may be configured arbitrarily. In other words, each of the pixels includes a transfer transistor, a reset transistor and a source follower transistor included in a source follower circuit, as a circuit for reading a signal from the photoelectric conversion element.

The photoelectric conversion apparatus further includes a column circuit 104, a comparing circuit 105, a reference power supply circuit 106, a counter circuit 107, a timing generator circuit (hereinafter called a TG circuit) 108, a signal holding circuit 109, a horizontal scanning circuit 110, a vertical scanning circuit 111, and a pixel drive circuit 112. The column circuit 104 is provided for each column signal line and includes a current source included in a source follower circuit. The column circuit 104 may have an amplifying unit that is provided for each column. The comparing circuit 105, reference power supply circuit 106, counter circuit 107, and signal holding circuit 109 may convert a signal that is an analog signal from the photoelectric conversion region 103 to a digital signal. In other words, they may function as an analog-digital converter. Notably, the comparing circuit 105 may also be called a comparator. The reference power supply circuit may supply reference voltage having a RAMP waveform, but the reference power supply circuit may have a digital-analog converter (DAC). The TG circuit 108 may generate a control signal that controls operations of the vertical scanning circuit 111, column circuit 104, reference power supply circuit 106, and horizontal scanning circuit 110. The pixel drive circuit 112 generates a signal for driving a transistor in a pixel on the basis of a signal from the vertical scanning circuit 111. The horizontal scanning circuit 110 controls an operation of sequentially reading signals based on a plurality of signal lines (column signal lines here) processed in parallel to a common signal line. According to this embodiment, the signal holding circuit 109 includes the common signal line. The signal holding circuit 109 further includes a plurality of signal holding elements such as what is called a memory. The signal holding circuit 109 may further include an adder element. A circuit that processes a signal from the photoelectric conversion region is a circuit that amplifies and converts a signal and may be the column circuit 104, comparing circuit 105, signal holding circuit 109, analog-digital converter or the like.

The photoelectric conversion apparatus according to this embodiment has an image signal processing unit 113. The image signal processing unit 113 has an image signal processing circuit 114, a microprocessor 115 and a signal holding circuit 116. The signal holding circuit 116 includes a plurality of memories, what is called signal holding elements, like the signal holding circuit 109. The photoelectric conversion apparatus has an input interface (hereinafter called an input IF) 117 and an output interface (hereinafter, called an output IF) 118.

In the photoelectric conversion apparatus of this embodiment, the components are provided on two substrates.

Figure 1C:
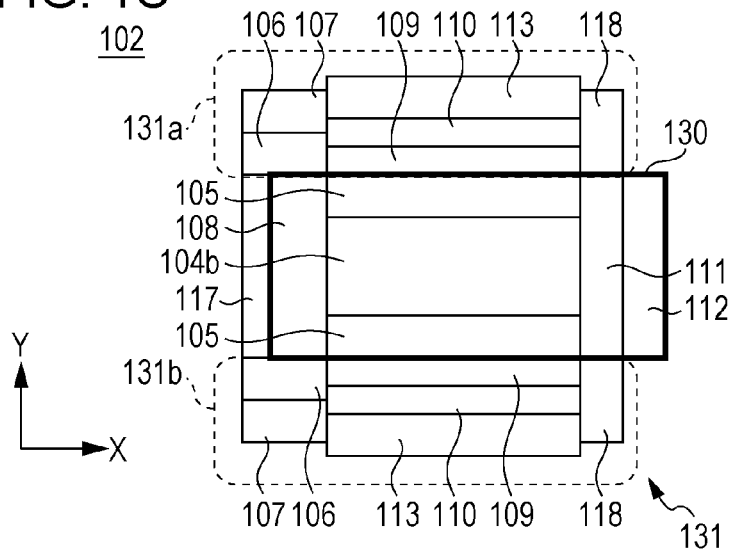
FIG. 1C is a block diagram for describing a second substrate of the photoelectric conversion apparatus of the first embodiment.
Figure 1D:
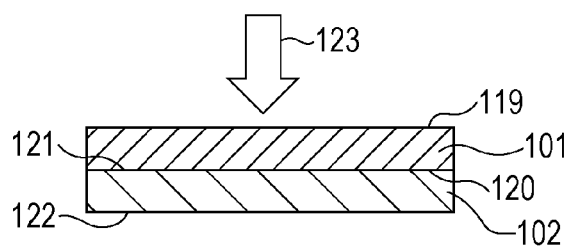
FIG. 1D is a schematic cross-section diagram for describing the overall photoelectric conversion apparatus of the first embodiment.

FIG. 1D schematically illustrates a cross-section of the two substrates in the photoelectric conversion apparatus of this embodiment. A first substrate 101 has a front side 120 and a back side 190, and a second substrate 102 has a front side 121 and a back side 122. The two substrates are connected or adhered such that the front side 120 of the first substrate 101 and the front side 121 of the second substrate 102 may face against each other to acquire the construction in FIG. 1D.

These two substrates may be electrically coupled with a through-electrode or a bump. A photoelectric conversion apparatus of this embodiment is what is called a backside illuminated photoelectric conversion apparatus in which light 123 enters to the back side 119 of the first substrate 101.

FIG. 1B and FIG. 1C are block diagrams for describing the first substrate and the second substrate. FIG. 1B and FIG. 1C are schematic diagrams when the configurations of the substrates are projected to the principal face of the second substrate and may be called plane layouts of the substrates. It is assumed here that the projection is performed from the direction indicated by the light "123" in FIG. 1D.

The first substrate 101 has, as illustrated in FIG. 1B, the photoelectric conversion region 103 and current sources 104a that are parts of the column circuit 104. The current source 104a is provided in the surrounding region 129 excluding the photoelectric conversion region 103. The surrounding region 129 has a first part 129a and a second part 129b across the photoelectric conversion region 103. Two current sources 104a are provided across the photoelectric conversion region 103. In other words, the current sources 104a are provided on two sides in the X axis direction of the rectangular photoelectric conversion region 103 that has sides in the X axis direction and sides in Y axis direction. In this case, the two current sources 104a are preferably equivalent circuit to increase the symmetry.

The second substrate 102 has components other than the photoelectric conversion region 103 and the current sources 104a, as illustrated in FIG. 1C. More specifically, the second substrate 102 has an amplifying unit 104b that is a part of the column circuit 104, the comparing circuit 105, the reference power supply circuit 106, the counter circuit 107, the TG circuit 108, the signal holding circuit 109, a horizontal scanning circuit 110, the vertical scanning circuit 111, and the pixel drive circuit 112. The second substrate 102 further includes the input IF 117 and the output IF 118. An overlapping area 130 that overlaps the photoelectric conversion region 103 in the orthogonal projection when the first substrate 101 and the second substrate 102 overlap, includes a first circuit that is driven by a first clock. The first circuit includes the amplifying unit 104b, comparing circuit 105, TG circuit 108, vertical scanning circuit 111, and pixel drive circuit 112. These circuits overlap the photoelectric conversion region 103. In other words, the first circuit is provided in the photoelectric conversion region 103 in an orthogonal projection projected to the principal face of the second substrate 102. The other area 131b includes a second circuit that is driven by a second clock having a higher frequency than that of the first clock. That is, the second circuit is driven by a higher drive frequency than the first circuit. The second circuit includes the reference power supply circuit 106, counter circuit 107, signal holding circuit 109, horizontal scanning circuit 110, image signal processing unit 113, input IF 117, and output IF 118. These circuits are not provided in the photoelectric conversion region 103 in the orthogonal projection projected toward the principal face of the second substrate 102 but are only provided in the surrounding region 129. According to this embodiment, the second circuit includes the counter circuit 107 and horizontal scanning circuit 110. This configuration may provide a stacked photoelectric conversion apparatus that reduces noise.

The second circuit exhibits a high heating value because it has a higher drive frequency and higher power consumption than the first circuit. Thus, the overlap of the circuit that functions as a heat source and the photoelectric conversion region 103 may transfer heat to the photoelectric conversion region 103 and increase noise. For example, even when a part of the circuit is provided in the photoelectric conversion region 103 in the orthogonal projection, heat is transferred to parts of the photoelectric conversion region 103, which may possibly cause image irregularities. Therefore, at least the second circuit on the second substrate 102 is desirably provided only in the surrounding region 129 in the orthogonal projection.

Here, for example, the first clock relates to a vertical scanning speed, and the second clock relates to horizontal scanning. For example, the first clock may be a clock for driving a part that processes signals or operations in parallel. The second clock may be a clock for driving a part that performs processing on signals or operations upon shift from parallel processing to serial processing. Thus, the first clock has a higher frequency than that of the second clock. More specifically, the second clock has a higher frequency of the first clock by a factor of 100 or higher, such as 500 or even 1200.

The area of the counter circuit 107 is generally a hundredth of the area of the photoelectric conversion region 103, and it is difficult to uniformly arrange the counter circuit 107 on the photoelectric conversion region 103. Providing the counter circuit 107 for each column may sometimes cause a heat distribution because signals may consume different amounts of current. The horizontal scanning circuit 110 may be a shift register circuit or a decoder, for example, which may have a quarter area of the area of the photoelectric conversion region 103. Therefore, it is difficult to uniformly arrange the horizontal scanning circuit 110 on the photoelectric conversion region 103. Uniform arrangement thereof may cause irregularities and/or streaky noise, which may possibly deteriorate the image quality. The second circuit whose orthogonal projected area having a half area of the area of the orthogonal projected area of the photoelectric conversion region is desirably arranged to superpose upon the surrounding region 129 of the first substrate 101.

According to this embodiment, the surrounding region 129 includes the first part 129a and the second part 129b, and the overlapping area 131 includes a third part 131a that correspondingly overlaps the first part 129a and a fourth part 131b that correspondingly overlaps the second part 129b. Any circuits provided in the first part 129a and second part 129b are the current sources 104a and are equivalent circuits. Circuits provided in the third part 131a and fourth part 131b are also the reference power supply circuit 106, counter circuit 107, signal holding circuit 109, horizontal scanning circuit 110, image signal processing unit 113, and output IF 118 and are equivalent circuits. These configurations may increase the symmetry of the signal output paths and may increase the image quality.

According to this embodiment, the reference power supply circuits 106 are further provided in the overlapping area 131. Each of the reference power supply circuits 106 may possibly be a heat source when it is a DAC or has many resistances, for example. Because the reference power supply circuits 106 generally have a tenth area of the photoelectric conversion region 103, it is difficult to arrange the reference power supply circuits 106 uniformly in the photoelectric conversion region 103. Providing such circuits in the overlapping area 131 may allow further reduction of noise of the photoelectric conversion apparatus.

The overlapping area 130 further has two comparing circuits 105 across the amplifying unit 104b and has the TG circuit 108 and the vertical scanning circuit 111 across the amplifying unit 104b. Providing the two comparing circuits 105 may increase the symmetry and allow output of signals from the two output IFs 118, which may increase the reading speed.

Because the image signal processing unit 113 includes the microprocessor 115 and the image signal processing circuit 114 that are driven by a higher frequency than that of the first clock, it is desirably provided in the other area 131. However, the image signal processing unit 113 having a larger area may be provided in the photoelectric conversion region in an orthogonal projection toward the second substrate in the principal face by disposing circuits such that the heating parts may be arranged uniformly within the image signal processing unit 113. The image signal processing unit 113 may be provided externally to the photoelectric conversion apparatus.

The surrounding region 129 may only be required to exclude the photoelectric conversion region 103 and is not limited to the region according to this embodiment.

Second Embodiment

Figure 2B:
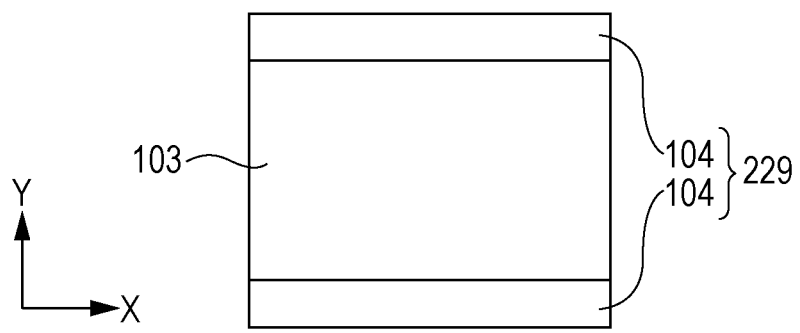
FIG. 2B is a block diagram for describing a first substrate of the photoelectric conversion apparatus of the second embodiment.
Figure 2C:
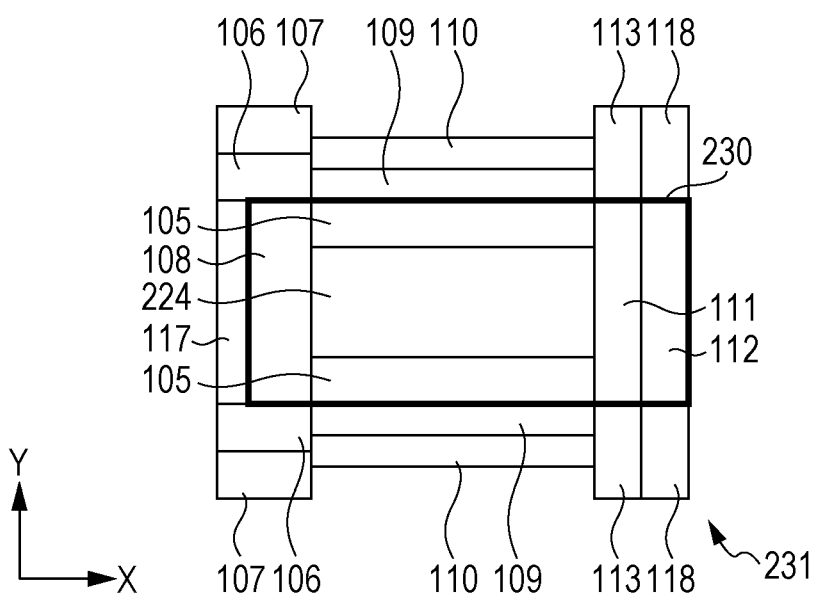
FIG. 2C is a block diagram for describing a second substrate of the photoelectric conversion apparatus of the second embodiment.

A photoelectric conversion apparatus of a second embodiment will be described with reference to FIGS. 2A, 2B and 2C. FIGS. 2A, 2B and 2C correspond to FIGS. 1A, 1B and 1C. FIG. 2A corresponds to FIG. 1A, FIG. 2B corresponds to FIG. 1B, and FIG. 2C corresponds to FIG. 1C. Like numbers refer to like components, and the descriptions will be omitted. The photoelectric conversion apparatus of this embodiment is different from the photoelectric conversion apparatus of the first embodiment in the arrangement of circuits in an overlapping area 230 overlapping the photoelectric conversion region 103 and circuits provided in the surrounding region 229 of the first substrate 101.

The photoelectric conversion apparatus of this embodiment includes, as illustrated in FIG. 2A and FIG. 2B, a photoelectric conversion region 103 and a column circuit 104 having both of the current source 104a and the amplifying unit 104b of the first embodiment on the first substrate 101. In other words, the surrounding region 229 of this embodiment includes the column circuit 104. As illustrated in FIG. 2C, an overlapping area 230 overlapping the photoelectric conversion region 103 of the second substrate 102 includes the comparing circuit 105, the TG circuit 108, the vertical scanning circuit 111, the pixel drive circuit 112, and a non-circuit part 224. The non-circuit part 224 is a part where no circuit is provided. Arranging the non-circuit part 224 over the photoelectric conversion region 103 may allow reduction of noise of the photoelectric conversion region 103.

Also according to this embodiment, the vertical scanning circuit 111 and the pixel drive circuit 112 are provided with respect to a side in the Y axis direction of the photoelectric conversion region 103 and receive a signal for driving pixels from a side in the Y axis direction of the photoelectric conversion region 103. This configuration may allow supply of a signal for driving pixels to the photoelectric conversion region 103 in the shortest distance.

Two comparing circuits 105 and signal holding circuits 109 are provided in the Y axis direction (vertical direction) in the overlapping areas 230 and 231 so that signals from the photoelectric conversion region 103 may be distributed in the Y axis direction (vertical direction) to be processed. In other words, the reading speed may be increased, like the first embodiment.

Third Embodiment

Figure 3A:
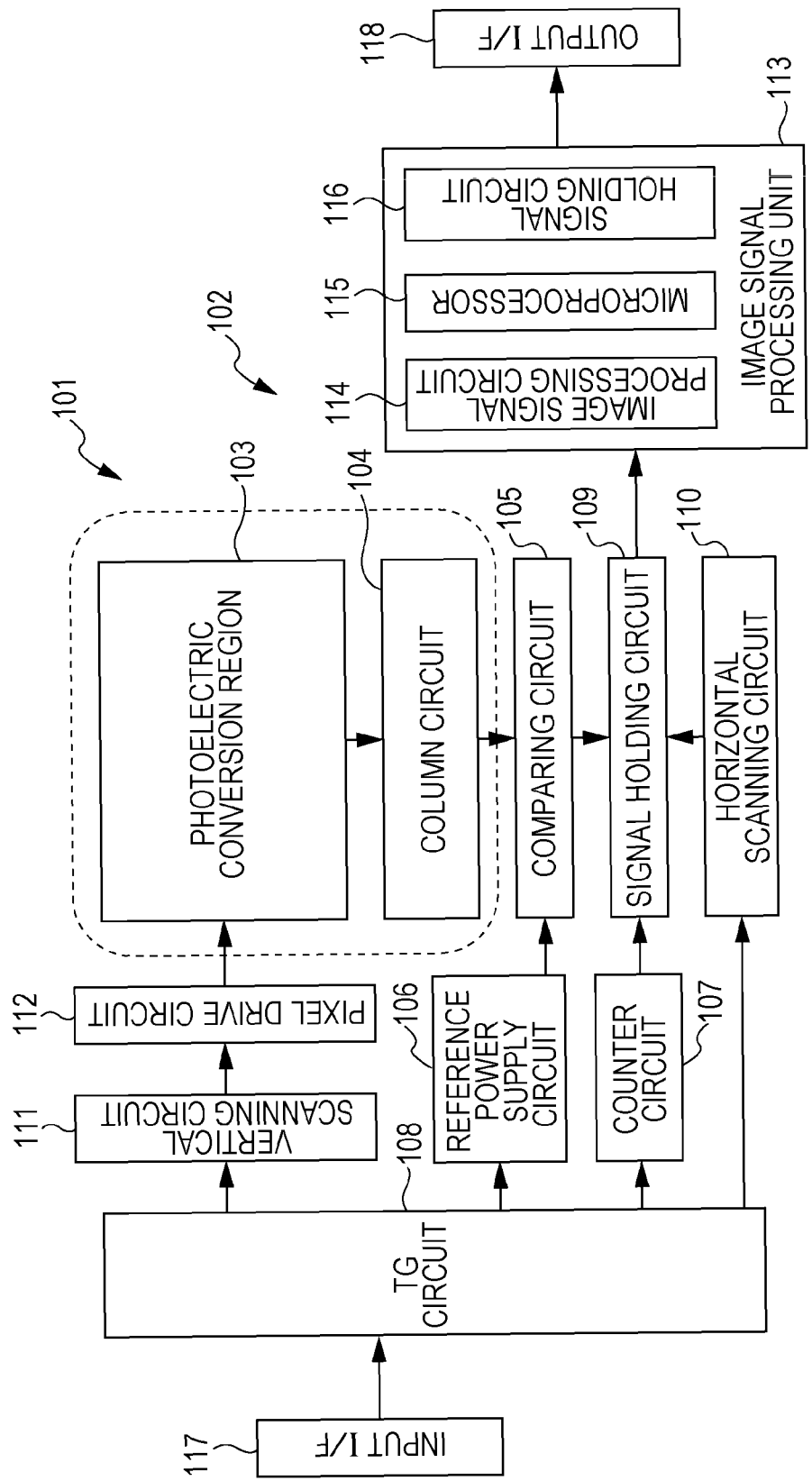
FIG. 3A is a block diagram for describing an overall photoelectric conversion apparatus of a third embodiment.
Figure 3B:
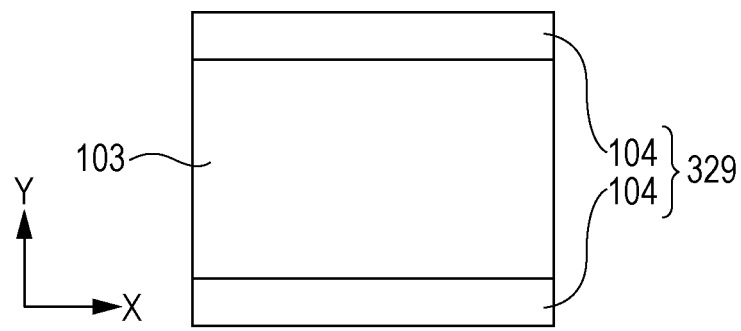
FIG. 3B is a block diagram for describing a first substrate of the photoelectric conversion apparatus of the third embodiment.
Figure 3C:
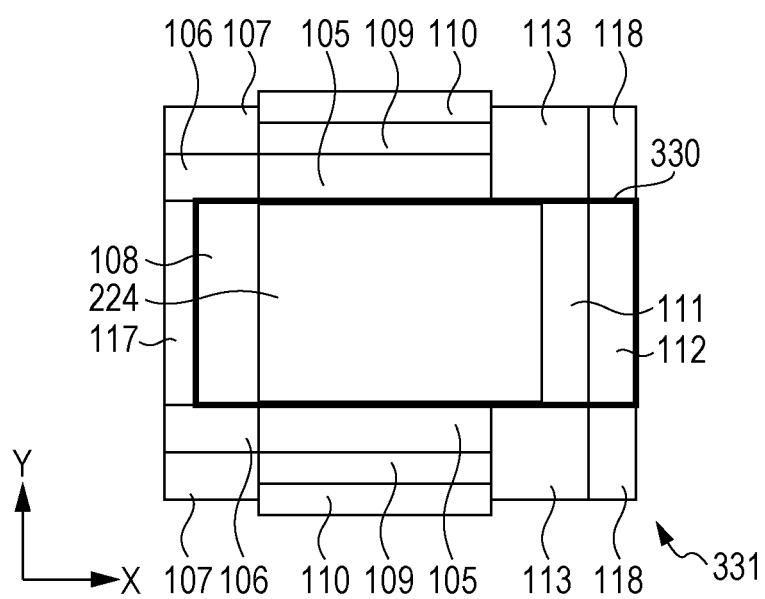
FIG. 3C is a block diagram for describing a second substrate of the photoelectric conversion apparatus of the third embodiment.

A photoelectric conversion apparatus according to a third embodiment will be described with reference to FIGS. 3A to 3C. FIGS. 3A to 3C correspond to FIGS. 1A to 1C and FIGS. 2A to 2C. The third embodiment will be described by comparing FIGS. 3A to 3C with FIGS. 2A to 2C (second embodiment). FIG. 3A corresponds to FIG. 2A, FIG. 3B corresponds to FIG. 2B, and FIG. 3C corresponds to FIG. 2C. Like numbers refer to like components, and the descriptions will be omitted. The photoelectric conversion apparatus of this embodiment is different from the photoelectric conversion apparatus of the second embodiment in the arrangement of circuits in an overlapping area 330 overlapping the photoelectric conversion region 103. Because FIG. 3A and FIG. 3B are the same as FIG. 2A and FIG. 2B, the descriptions will be omitted.

The photoelectric conversion apparatus of this embodiment includes, as illustrated in FIG. 3C, the TG circuit 108, the vertical scanning circuit 111, the pixel drive circuit 112, and the non-circuit part 224, excluding the comparing circuit 105, in the overlapping area 330 overlapping the photoelectric conversion region 103 of the second substrate 102. In other words, the first circuit does not have the comparing circuit 105 but includes the TG circuit 108, vertical scanning circuit 111, pixel drive circuit 112, and non-circuit part 224. This configuration also according to this embodiment may allow reduction of noise of the photoelectric conversion apparatus.

In the Y axis direction, two overlapping areas 331 are provided across the overlapping area 330. Circuits are arranged in the overlapping areas 331 with high symmetry, and signals from the photoelectric conversion region 103 are distributed in the Y axis direction (vertical direction) to be processed.

The signal holding circuit may sometimes have an equal area to the area of the photoelectric conversion region 103. In that case, the non-circuit part 224 is preferably provided.

Fourth Embodiment

Figure 4A:
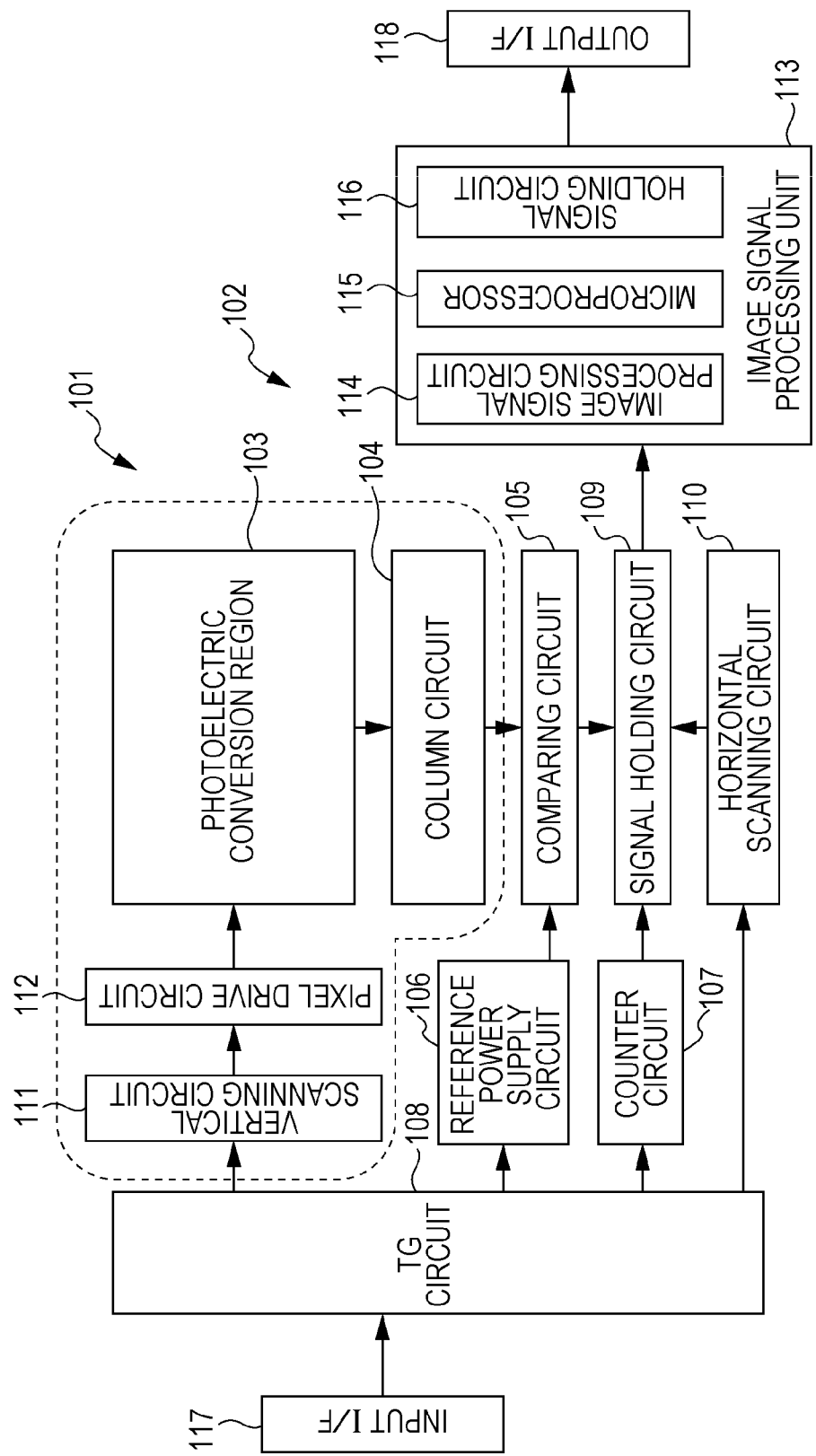
FIG. 4A is a block diagram for describing an overall photoelectric conversion apparatus of a fourth embodiment.
Figure 4B:
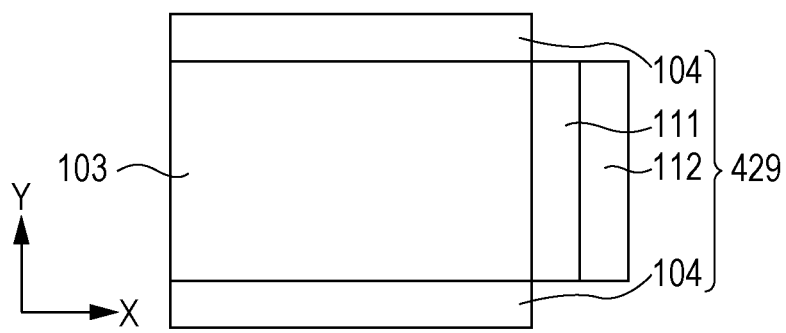
FIG. 4B is a block diagram for describing a first substrate of the photoelectric conversion apparatus of the fourth embodiment.
Figure 4C:
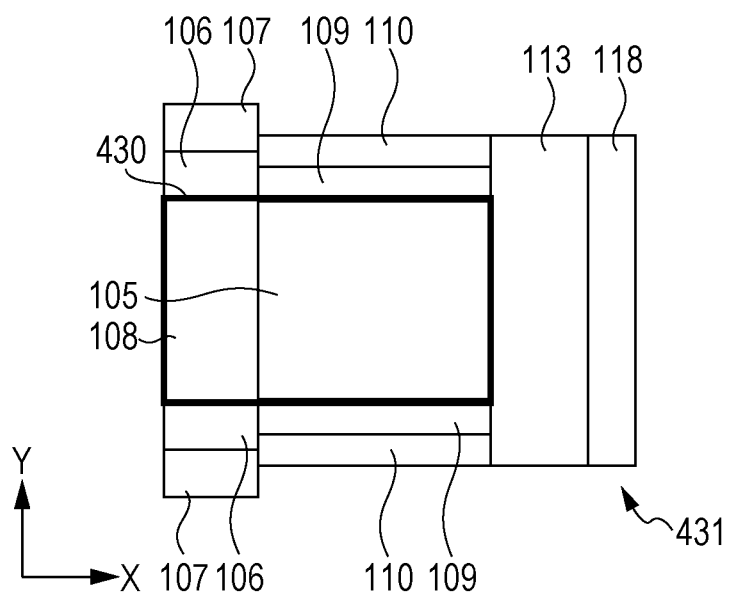
FIG. 4C is a block diagram for describing a second substrate of the photoelectric conversion apparatus of the fourth embodiment.

A photoelectric conversion apparatus according to a fourth embodiment will be described with reference to FIGS. 4A to 4C. FIGS. 4A to 4C correspond to FIGS. 1A to 1C to FIGS. 3A to 3C. The fourth embodiment will be described by comparing FIGS. 4A to 4C with FIGS. 1A to 2C (second embodiment). FIG. 4A corresponds to FIG. 2A, FIG. 4B corresponds to FIG. 2B, and FIG. 4C corresponds to FIG. 2C. Like numbers refer to like components, and the descriptions will be omitted. The photoelectric conversion apparatus of this embodiment is different from the photoelectric conversion apparatus of the second embodiment in arrangement of circuits in the overlapping area 430 overlapping the photoelectric conversion region 103 and circuits provided in the surrounding region 429 of the first substrate 101.

The photoelectric conversion apparatus of this embodiment includes the photoelectric conversion region 103, the column circuit 104, the vertical scanning circuit 111, and the pixel drive circuit 112 on the first substrate 101 as illustrated in FIG. 4A and FIG. 4B. In other words, the surrounding region 229 of this embodiment includes the column circuit 104, vertical scanning circuit 111, and pixel drive circuit 112. As illustrated in FIG. 4C, the comparing circuit 105 and TG circuit 108 are only arranged in the overlapping area 430 overlapping the photoelectric conversion region 103 of the second substrate 102. In other words, the first circuit includes the comparing circuit 105 and the TG circuit 108. This configuration allows reduction of noise of the photoelectric conversion apparatus also according to this embodiment.

Furthermore, according to this embodiment, one output IF 118 is provided, and the number of terminals may be reduced.

Fifth Embodiment

Figure 5A:
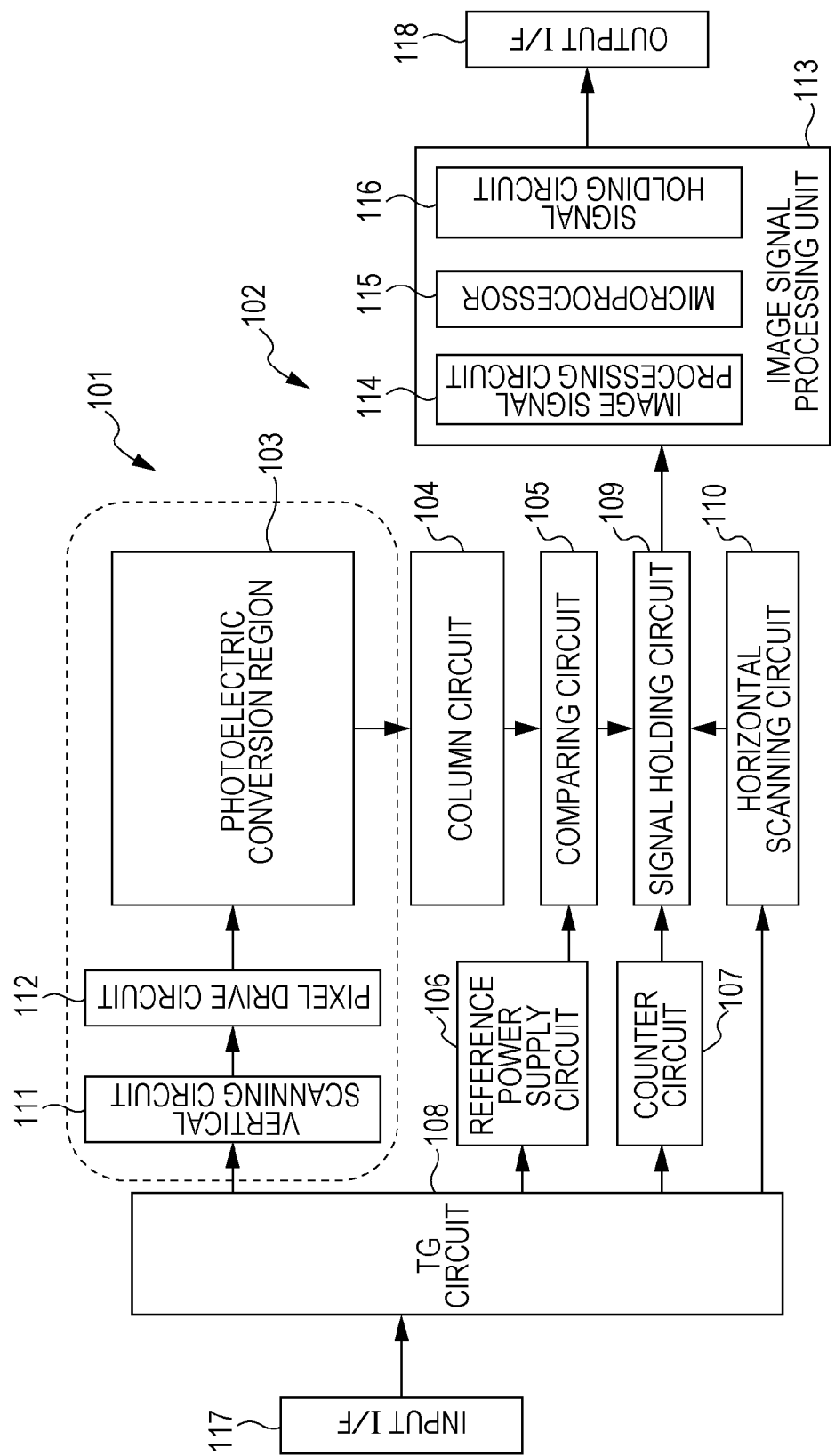
FIG. 5A is a block diagram for describing an overall photoelectric conversion apparatus of a fifth embodiment.
Figure 5B:
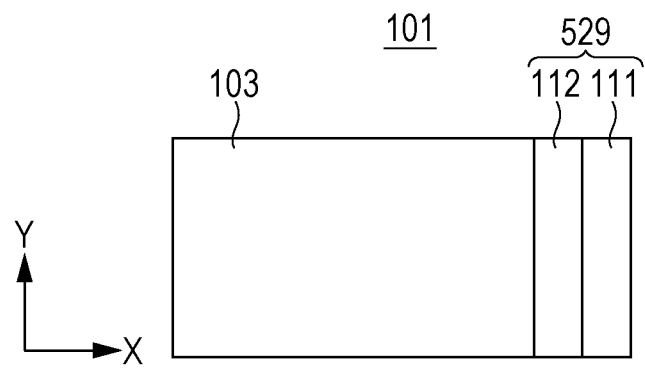
FIG. 5B is a block diagram for describing a first substrate of the photoelectric conversion apparatus of the fifth embodiment.
Figure 5C:
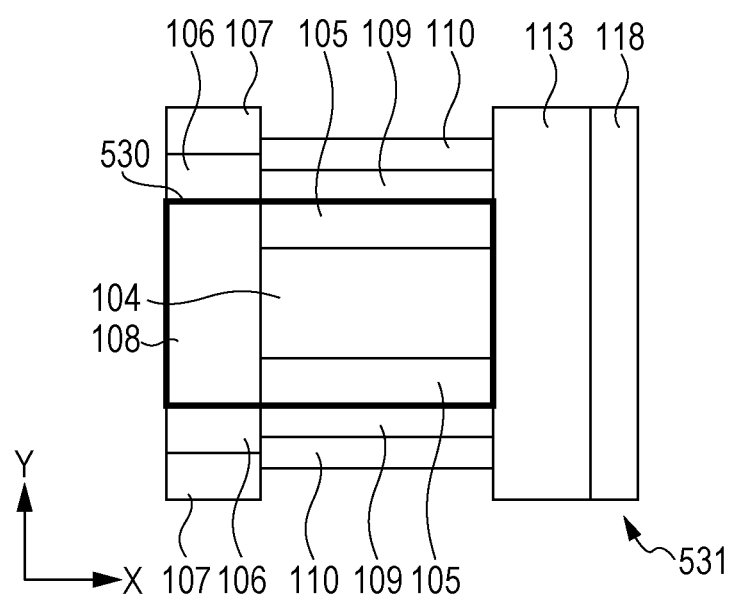
FIG. 5C is a block diagram for describing a second substrate of the photoelectric conversion apparatus of the fifth embodiment.

A photoelectric conversion apparatus of this embodiment will be described with reference to FIGS. 5A to 5C. FIGS. 5A to 5C correspond to FIGS. 1A to 1D to FIGS. 4A to 4C. The fifth embodiment will be described by comparing FIGS. 5A to 5C with FIGS. 4A to 4C (fourth embodiment). FIG. 5A corresponds to FIG. 4A, FIG. 5B corresponds to FIG. 4B, and FIG. 5C corresponds to FIG. 4C. Like numbers refer to like components, and the descriptions will be omitted. The photoelectric conversion apparatus of this embodiment is different from the photoelectric conversion apparatus of the fourth embodiment in arrangement of circuits in the overlapping area 430 overlapping the photoelectric conversion region 103 and circuits provided in the surrounding region 529 of the first substrate 101.

The photoelectric conversion apparatus of this embodiment includes the photoelectric conversion region 103, the column circuit 104, the vertical scanning circuit 111, and the pixel drive circuit 112 on the first substrate 101 as illustrated in FIG. 5A and FIG. 5B. The surrounding region 229 of this embodiment includes the vertical scanning circuit 111, and pixel drive circuit 112. In other words, this embodiment is different from the fourth embodiment in that the column circuit 104 is not provided on the first substrate 101. As illustrated in FIG. 5C, the column circuit 104, comparing circuit 105 and TG circuit 108 are arranged in an overlapping area 530 overlapping the photoelectric conversion region 103 of the second substrate 102. In other words, the first circuit includes the column circuit 104, comparing circuit 105 and the TG circuit 108. This configuration allows reduction of noise of the photoelectric conversion apparatus also according to this embodiment.

Sixth Embodiment

Figure 6A:
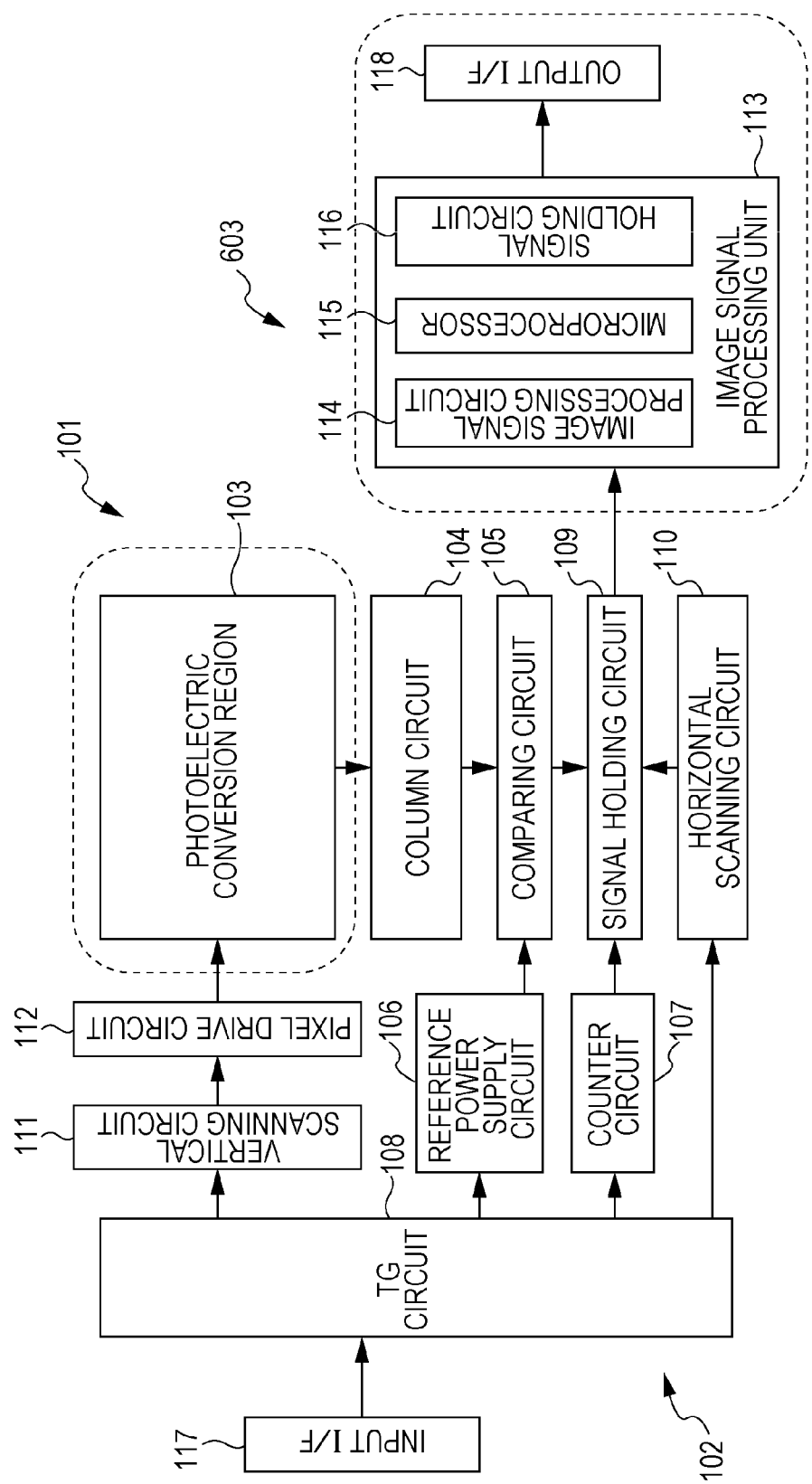
FIG. 6A is a block diagram for describing an overall photoelectric conversion apparatus of a sixth embodiment.
Figure 6B:
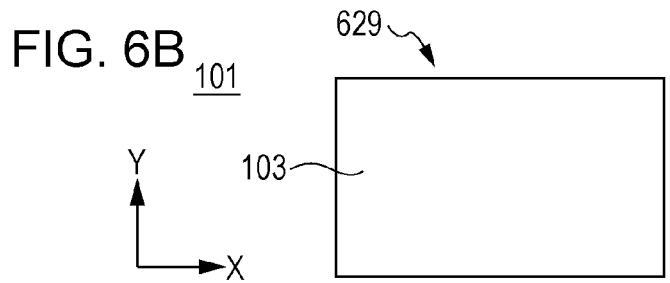
FIG. 6B is a block diagram for describing a first substrate of the photoelectric conversion apparatus of the sixth embodiment.
Figure 6C:
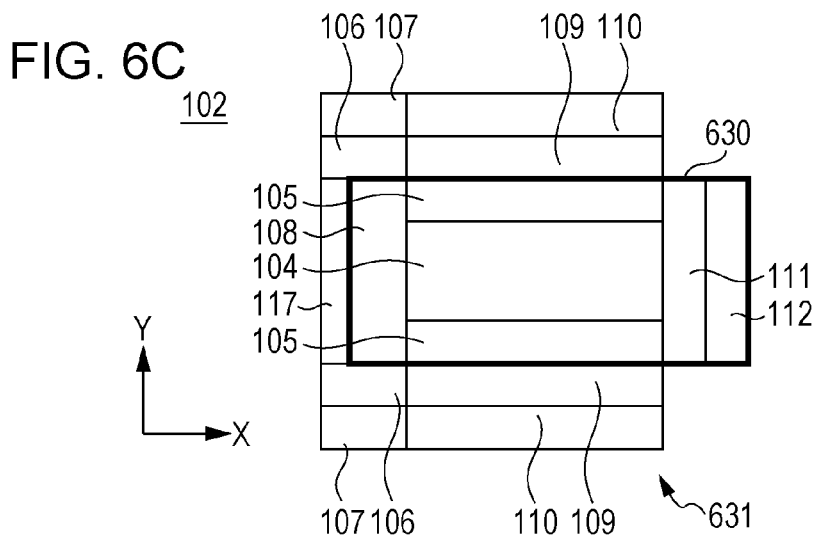
FIG. 6C is a block diagram for describing a second substrate of the photoelectric conversion apparatus of the sixth embodiment.
Figure 6D:
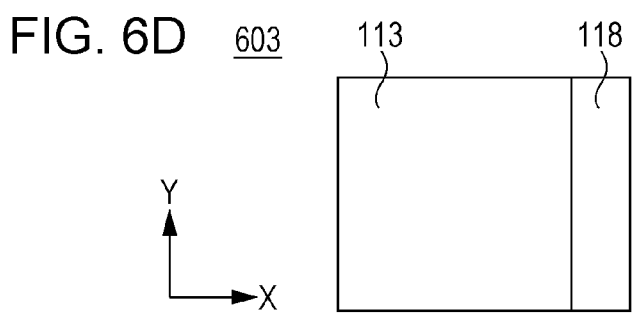
FIG. 6D is a block diagram for describing a third substrate of the photoelectric conversion apparatus of the sixth embodiment.

A photoelectric conversion apparatus according to a sixth embodiment will be described with reference to FIGS. 6A to 6E. This embodiment will be described by comparing FIGS. 6A to 6E with FIGS. 1A to 1D (first embodiment). FIG. 6A corresponds to FIG. 1A, FIG. 6B corresponds to FIG. 1B, FIG. 6C corresponds to FIG. 1C, and FIG. 6E corresponds to FIG. 1E. FIG. 6D is a block diagram illustrating a third substrate which is newly provided in this embodiment. Like numbers refer to like components, and the descriptions will be omitted. The photoelectric conversion apparatus of this embodiment is largely different from the photoelectric conversion apparatus of the first embodiment in that the sixth embodiment has a third substrate 603.

Figure 6E:
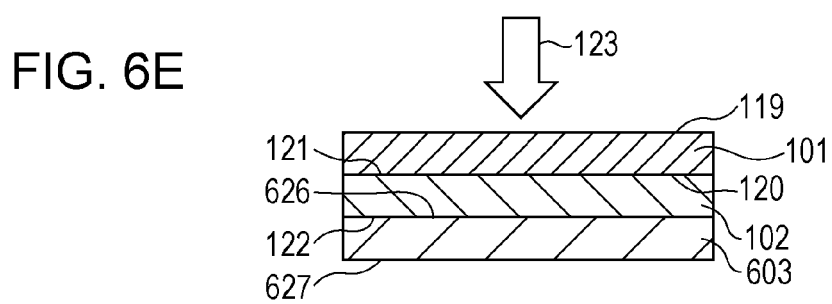
FIG. 6E is a schematic cross-section diagram for describing the overall photoelectric conversion apparatus of the sixth embodiment.

As illustrated in FIG. 6A, the image signal processing unit 113 and the output IF 118 are provided on the third substrate 603 of this embodiment. The third substrate 603 is arranged to overlap the first substrate 101 and the second substrate 102. As illustrated in FIG. 6E, a face 626 of the third substrate 603 having a front side 626 and a back side 627 is provided in contact with the back side 122 of the second substrate 102.

In the photoelectric conversion apparatus, the first substrate 101 only has the photoelectric conversion region 103, and a surrounding region 629 does not have a circuit and so on. The second substrate 102 includes the column circuit 104, comparing circuit 105, TG circuit 108, vertical scanning circuit 111, pixel drive circuit 112, reference power supply circuit 106, counter circuit 107, signal holding circuit 109, horizontal scanning circuit 110, and input IF 117. An overlapping area 630 overlapping the photoelectric conversion region 103 has the column circuit 104, comparing circuit 105, TG circuit 108, vertical scanning circuit 111, and pixel drive circuit 112, which are included in a first circuit. The other overlapping area 631 including a second circuit overlaps the surrounding region 629. The third substrate 603 has the image signal processing unit 113 and the output IF 118. The image signal processing unit 113 may often include a microprocessor 115 and/or image signal processing circuit 114 which may process a signal in synchronism with a clock having a higher frequency than that of the second clock. However, because the second substrate 102 is provided between the third substrate 603 and the first substrate 101 having the photoelectric conversion region 103, the image signal processing unit 113 is less influenced by heat. Therefore, the photoelectric conversion region 103 and the image signal processing unit 113 may be arranged to superpose one upon the other. This configuration allows reduction of noise of the photoelectric conversion apparatus also according to this embodiment.

Seventh Embodiment

Figure 7B:
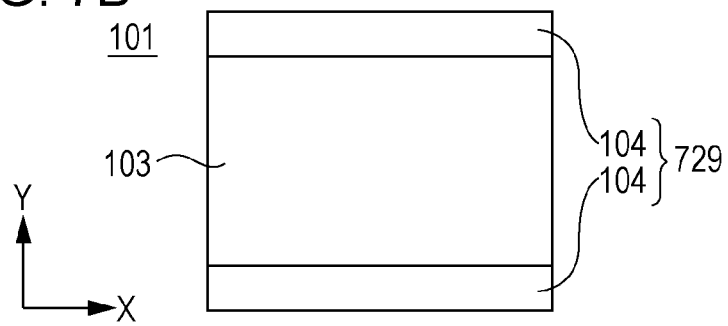
FIG. 7B is a block diagram for describing a first substrate of the photoelectric conversion apparatus of the seventh embodiment.
Figure 7C:
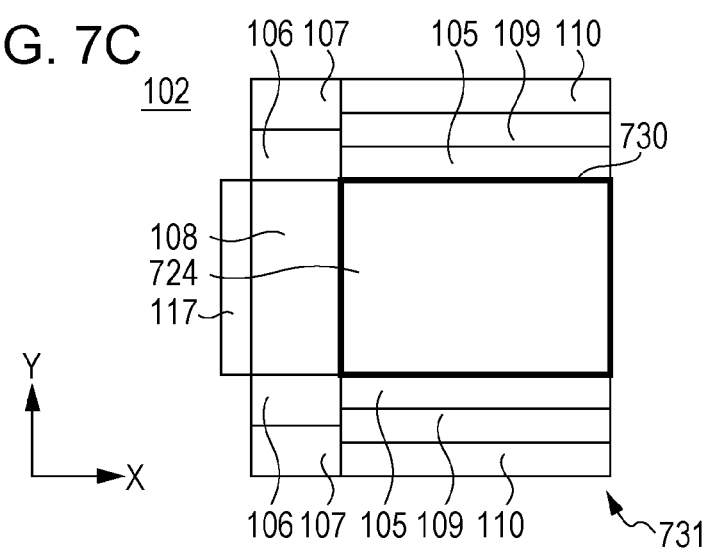
FIG. 7C is a block diagram for describing a second substrate of the photoelectric conversion apparatus of the seventh embodiment.
Figure 7D:
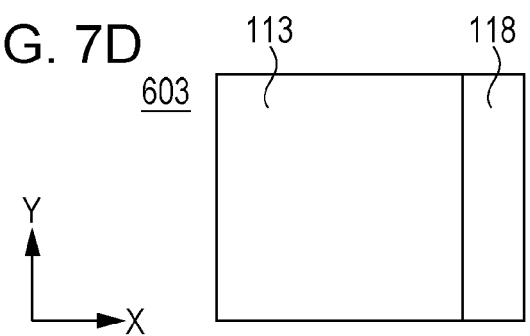
FIG. 7D is a block diagram for describing a third substrate of the photoelectric conversion apparatus of the seventh embodiment.

A photoelectric conversion apparatus according to a fourth embodiment will be described with reference to FIGS. 7A to 7D. The seventh embodiment will be described by comparing FIGS. 7A to 7D with FIGS. 6A to 6D (sixth embodiment). FIG. 7A corresponds to FIG. 6A, FIG. 7B corresponds to FIG. 6B, FIG. 7C corresponds to FIG. 6C, and FIG. 7D corresponds to FIG. 6D. Like numbers refer to like components, and the descriptions will be omitted. The photoelectric conversion apparatus of this embodiment is different from the photoelectric conversion apparatus of the sixth embodiment in circuits provided on the first substrate 101 and circuits provided in an overlapping area 730 overlapping the photoelectric conversion region 103. Because the same as the sixth embodiment is true for the third substrate 603 of the photoelectric conversion apparatus of this embodiment, the description will be omitted.

As illustrated in FIG. 7A and FIG. 7B, the first substrate 101 of this embodiment has the photoelectric conversion region 103 and column circuit 104. In other words, the column circuit 104 is provided in a surrounding region 729. An overlapping area 730 of the second substrate 102 is a non-circuit part 724 where no circuits are arranged. This configuration also allows reduction of noise of the photoelectric conversion apparatus.

An image pickup system including the photoelectric conversion apparatus as described above will be described as application examples of the photoelectric conversion apparatus. The concept of the image pickup system includes not only an apparatus (such as a still camera and a camcorder) whose main purpose is imaging but also an apparatus (such as a personal computer and a mobile terminal) having an imaging function auxiliarily. The image pickup system includes a photoelectric conversion apparatus described according to one of the aforementioned embodiments and a processing unit that processes a signal output from the photoelectric conversion apparatus. Alternatively, the image pickup system may have an optical system (such as a lens) for forming an image in a photoelectric conversion apparatus described according to one of the aforementioned embodiments.

As described according to the aforementioned embodiments, a photoelectric conversion apparatus according to any one of the aforementioned embodiments may allow reduction of noise and may provide high quality images.

A photoelectric conversion apparatus of the present invention is not limited to the aforementioned embodiments. For example, the embodiments may be changed and/or combined properly.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-043964, filed Feb. 29, 2012, which is hereby incorporated by reference herein in its entirety.

What is claimed is:

1. A photoelectric conversion apparatus comprising:
a first substrate including a first region containing a photoelectric conversion element and a source follower transistor of a source follower circuit for reading a signal from the photoelectric conversion element, and a second region surrounding the first region; and
a second substrate including a first circuit with a first drive frequency and a second circuit with a second drive frequency, the second drive frequency being higher than the first drive frequency, and
wherein the first circuit overlaps the first region, and the second circuit overlaps the second region.

2. The photoelectric conversion apparatus according to claim 1, wherein
the second circuit includes a scanning circuit for outputting signals from a plurality of signal lines to a common signal line.

3. The photoelectric conversion apparatus according to claim 1, wherein
the second circuit includes a counter circuit of an analog-digital converter.

4. The photoelectric conversion apparatus according to claim 1, wherein,
the second region includes a first part and a second part, the first region being positioned between the first part and the second part, and
the second circuit includes a third part and a fourth part, the third part overlaps the first part and the fourth part overlaps the second part, and the fourth part having an equivalent circuit to that of the third part.

5. The photoelectric conversion apparatus according to claim 1,
wherein the first circuit includes a signal holding circuit, the signal holding circuit overlaps the first region.

6. The photoelectric conversion apparatus according to claim 1, wherein the second substrate has a part where no circuit is provided, and the part overlaps the first region.

7. The photoelectric conversion apparatus according to claim 1, wherein a third substrate that overlaps the first substrate and the second substrate is disposed so that the second substrate is positioned between the first substrate and the third substrate.

8. An image pickup system comprising:
the photoelectric conversion apparatus according to claim 1; and
a processing circuit for processing a signal from the photoelectric conversion apparatus.

9. The photoelectric conversion apparatus according to claim 1, wherein the first circuit includes a comparing circuit of an analog-digital converter.

10. The photoelectric conversion apparatus according to claim 1, wherein the first circuit includes a timing generator circuit that generates a control signal to control operations of another circuit.

11. The photoelectric conversion apparatus according to claim 1, wherein the first circuit includes a pixel drive circuit that generates a signal for driving a transistor of each of a plurality of pixels disposed in the first region.

12. The photoelectric conversion apparatus according to claim 11, wherein the first circuit includes a scanning circuit that output a signal to the pixel drive circuit.

13. The photoelectric conversion apparatus according to claim 1, wherein the second region contains a pixel drive circuit that generates a signal for driving a transistor of each of a plurality of pixels disposed in the first region.

14. The photoelectric conversion apparatus according to claim 13, wherein the second region contains a scanning circuit that outputs a signal to the pixel drive circuit.

15. The photoelectric conversion apparatus according to claim 1, wherein the second region contains a current source of the source follower circuit.

16. The photoelectric conversion apparatus according to claim 13, wherein the first circuit includes an amplifying unit.

17. The photoelectric conversion apparatus according to claim 1, wherein the first circuit includes an amplifying unit.

18. The photoelectric conversion apparatus according to claim 1, wherein the second substrate includes a scanning circuit for outputting signals from a plurality of signal lines to a common signal line and an image signal processing unit connected to the common signal line.

19. A photoelectric conversion apparatus comprising:
a first substrate including a first region including a plurality of a photoelectric conversion element and a source follower transistor of a source follower circuit for reading a signal from the photoelectric conversion element, and a second region surrounding the first region; and
a second substrate including a comparator of an analog-digital converter, and an image signal processing unit,
wherein the comparator overlaps the first region, and the image signal processing unit overlaps the second region.

20. A photoelectric conversion apparatus comprising:
a first substrate including a first region including a plurality of a photoelectric conversion element, and a second region surrounding the first region; and
a second substrate including a comparator of an analog-digital converter, a reference power supply circuit which supplies a reference voltage to the comparator, a timing generator that generates a control signal to control operations of the reference power supply circuit, and an image signal processing unit, and
wherein the timing generator overlaps the first region, and the image signal processing unit overlaps the second region.

* * * * *